(12) United States Patent
Juso et al.

(10) Patent No.: US 6,250,606 B1
(45) Date of Patent: Jun. 26, 2001

(54) SUBSTRATE FOR SEMICONDUCTOR DEVICE, SEMICONDUCTOR DEVICE AND MANUFACTURING METHOD THEREOF

(75) Inventors: Hiroyuki Juso, Gose; Yoshiki Sota, Nara, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/534,120

(22) Filed: Mar. 23, 2000

(30) Foreign Application Priority Data

Jun. 29, 1999 (JP) .................................................. 11-182803

(51) Int. Cl.⁷ .................................................. H01L 23/04
(52) U.S. Cl. ........................... 251/698; 257/774; 438/637
(58) Field of Search .................................. 257/784, 786, 257/774, 775, 698; 361/771, 772, 774; 438/638, 637, 639, 640, 700, 667

(56) References Cited

U.S. PATENT DOCUMENTS

| 3,567,844 | * | 3/1971 | Kremar . |
| 5,513,076 | * | 4/1996 | Werther . |
| 6,031,283 | * | 2/2000 | Banerjee et al. . |
| 6,106,923 | * | 8/2000 | Takahashi et al. . |
| 6,166,441 | * | 12/2000 | Geryk . |
| 6,175,158 | * | 1/2001 | Degani et al. . |
| 6,201,707 | * | 3/2001 | Sota . |

FOREIGN PATENT DOCUMENTS

| 9-121002 | 5/1997 | (JP) . |
| 11-87427 | 3/1999 | (JP) . |

* cited by examiner

Primary Examiner—Sheila V. Clark
(74) Attorney, Agent, or Firm—Nixon & Vanderhye P.C.

(57) ABSTRACT

A rectangular semiconductor chip is mounted on an insulating substrate having a plurality of first through holes the opening area of which increases toward the side of the surface of the opening, the insulating substrate is provided with a wiring pattern having conductive land portions covering the entire surface of the opening of each of the first through holes on the side of the semiconductor chip mounting surface, and an external connection terminal is connected to the entire surface of a land portion exposed from the first through hole, and the opening shape of the first through hole is a circular shape having a projected portion at least in a region including a region on a circumference the farthest from the center of the semiconductor chip.

33 Claims, 9 Drawing Sheets

93b 93a 93

94d 94 94a

SUBSTRATE FOR SEMICONDUCTOR DEVICE, SEMICONDUCTOR DEVICE AND MANUFACTURING METHOD THEREOF

BACKGROUND OF THE INVENTION

1. Field of the Invention

The present invention relates generally to a substrate for a semiconductor device, a semiconductor device and a manufacturing method thereof, and more particularly, to a resin encapsulation type semiconductor device reduced substantially to a chip size suitable for high density packaging.

2. Description of the Background Art

Chip-size Package (CSP) semiconductor devices such as QFP (Quad Flat Package) type or BGA (Ball Grid Array) type devices have been in wide use to cope with the recent trend toward lighter and more compact apparatus in the market of electrical appliances and adapt to automated assembly process. Increased speed and number of functions in signal processing by semiconductor elements incorporated in these semiconductor devices require a larger number of external connection terminals.

In such a case, a BGA type device having external connection terminals arranged two-dimensionally at the bottom of the semiconductor device is employed. Some devices are formed to be as small as possible so that they can be incorporated into compact mobile equipment, in other words they are formed to have a size close to the chip size. In one of such BGA type devices, with the surface of a semiconductor chip having MOS transistors or the like formed facing up, connection is made to a wiring (interconnection) board by wire bonding to provide conduction with external connection terminals via a wiring (interconnection) pattern.

A cross section of a conventional resin encapsulation type semiconductor device (Japanese Patent Laying-Open No. 9-121002) is given in FIG. 16.

As shown in FIG. 16, a semiconductor chip 11 is mounted on an insulating substrate 15, and a wiring pattern 16 for connection with semiconductor chip 11 is formed in an outer peripheral region of semiconductor chip 11. Semiconductor chip 11 and wiring pattern 16 are electrically connected by wire bonding using a gold (Au) wire 13. Provided in a region between semiconductor chip 11 and insulating substrate 15 is a land 17 for connection with an external connection terminal which covers the entire opening of a through hole 19 and is electrically connected with wiling pattern 16. Semiconductor chip 11 and Au wire 13 are encapsulated with resin 12, and an external connection terminal 14 is electrically connected to land 17 via through hole 19.

In the semiconductor device having this configuration, through hole 19 of insulating substrate 15 for connecting external connection terminal 14 is formed using dice or a drill, by etching or the like. In the case using dice, if the position, size or number of through holes 19 is changed, dice must be manufactured based on each size, resulting in significant increase in the cost. If a drill is used, the number of steps/cost included in the manufacture of the insulating substrate increases as a function of increase in the number of through holes.

Meanwhile, if through hole 19 is formed by etching, the position, number and size of through holes can be changed simply by changing the mask used for etching the insulating substrate, and therefore such changes can be made less costly. Furthermore, the shape of the through hole can be readily changed.

FIG. 17 is a cross sectional view of insulating substrate 15 having through hole 19 formed by dice or a d(ill, and FIG. 18 is a cross sectional view of insulating substrate 15 having through hole 19 processed by etching. In the case of processing with dice or the like, the wall surface of through hole 19 is formed substantially perpendicular to the forming surface of wiring pattern 16, while in the case of etching, the resulting wall surface of through hole 19 is tapered rather than being perpendicular.

A land shape modified by providing a groove at the wall of a through hole is suggested by the disclosure of a conventional BGA-type semiconductor device (Japanese Patent Laying-Open No. 11-87427), and according to this conventional technique, an escape passage is provided for flux when a solder ball is mounted in order to improve the placing characteristic of the solder ball. Since the land portion does not entirely cover the substrate side of the through hole, the reliability is degraded accordingly.

The above-described semiconductor device is compact and has an area array structure. A semiconductor device having such a configuration is mounted by reflow on a wiring board such as a printed circuit board. After the mounting by reflow, stress is generated at the connection portion between the semiconductor device and the wiring board because of their different line expansion coefficients or the like in a heating cycle or the like. The above-described semiconductor device has one side of the semiconductor chip encapsulated with mold resin, and therefore a bowing part forms in the semiconductor device as shown in FIG. 19 if the temperature changes because of a phenomenon characteristic to a bimetal-like structure of the semiconductor chip and mold resin. The above difference in the line expansion coefficients or the bowing of the semiconductor device could cause cracks at the connection portion between the semiconductor device and wiring board 18, leading to breaking in some cases.

The structure as shown in FIG. 17 in which the wall of the through hole in the insulating substrate is perpendicular to the circuit forming surface is different from the tapered structure as shown in FIG. 18 in the shape of the connection portion between the semiconductor device and the wiring board. The connection portions take shapes conforming to the wall of through hole 19 as shown in FIGS. 20 and 21. If external connection terminal 14 has different shapes as in these figures, the distribution of stress will be different between the connection portions, resulting in different resistance to thermal stress. More specifically, in the structure in FIG. 20, since the stress is dispersed, a high reliability level is secured, while in the case of the tapered structure, the stress concentrates around position A in FIG. 21 and therefore the reliability level is lower in the tapered structure under the same conditions. Hence, changing the shape of the connection portion so as to reduce the concentration of the stress would improve the reliability level.

Since the stress imposed upon the connection portion between the wiring board and the package is generated by difference between the line expansion coefficients of the wiring board and the package and the bowing of the package, the direction of the stress runs radially from the center of the package and the magnitude of the stress increases as a function of the distance from the center of the package.

SUMMARY OF THE INVENTION

It is an object of the present invention is to provide a substrate for a semiconductor device having a through hole for connecting a wiring pattern for an insulating substrate and an external connection terminal, formed by etching, which allows the cost to be reduced and the design to be easily changed without lowering the reliability level, and to provide a semiconductor device having such a substrate.

A substrate for a semiconductor device according to one aspect of the present invention includes an insulating substrate and a conductive layer. The insulating substrate has one surface, the other surface opposing this one surface, and a plurality of first through holes communicating between the one surface and the other surface. The conductive layer has a conductive portion formed to cover the openings of the first though holes at the one surface of the insulating substrate. The first through holes are defined by the sidewall surface of the insulating substrate which is formed such that the opening area of the first through hole increases from the one surface to the other surface. The shape of the opening of the first through holes has a projected portion at a part where stress is concentrated when the insulating substrate having a semiconductor chip mounted on the one surface is mounted on and connected to a mounting or wiring board by an external connection terminal joined through the first through hole to the conductive portion.

In the region of the insulating substrate without the conductive layer, preferably formed is a second through hole communicating between the one surface and the other surface. The shape of the opening of the second through hole preferably has a corner portion.

A substrate for a semiconductor device according to another aspect of the present invention includes an insulating substrate and a conductive layer. The insulating substrate has one surface, the other surface opposing the one surface, and a plurality of first through holes communicating between the one surface and the other surface. The conductive layer has a conductive portion formed to cover the openings of the first through holes at the one surface of the insulating substrate. The first through hole is defined by the sidewall surface of the insulating substrate which is formed such that the opening area of the first through hole increases from the one surface to the other surface of the insulating substrate. The shape of the openings of the first through holes has a projected portion at a part of the sidewall surface of the insulating substrate the farthest from the center of the semiconductor chip, when the insulating substrate having a semiconductor chip mounted on the one surface is mounted on and connected to a mounting or wiring board by an external connection terminal joined through the first through hole to the conductive portion.

The shape of the opening of the first through holes positioned immediately under the semiconductor chip and the closest to each of the four corners of the semiconductor chip preferably has a projected portion at a part of the sidewall surface of the insulating substrate the farthest from the center of the semiconductor chip.

The shape of the opening of the first through hole positioned outside the outer peripheral edge of the semiconductor chip preferably has a projected portion at a part of the sidewall surface of the insulating substrate the closest to the center of the semiconductor chip. The shape of the opening of the first through hole positioned outside the outer peripheral edge of the semiconductor chip and the closest to each of the four corners of the semiconductor chip preferably has a projected portion at a part of the sidewall surface of the insulating substrate the closest to the center of the semiconductor chip.

The shape of the opening of the first through hole preferably has a first projected portion at a part of the sidewall surface of the insulating substrate the farthest from the center of the semiconductor chip and a second projected portion at a part of the sidewall surface of the insulating substrate the closest to the center of the semiconductor chip. Furthermore, the shape of the opening of the first through hole preferably has third and fourth projected portions between the first and second projected portions, respectively.

In the region of the insulating substrate without the conductive layer, preferably formed is a second through hole communicating between the one surface and the other surface. The shape of the opening of the second through hole preferably has a corner portion.

A semiconductor device according to another aspect of the present invention includes an insulating substrate, a conductive layer, a semiconductor chip, and an external connection terminal. The insulating substrate has one surface, the other surface opposing the one surface, and a plurality of first through holes communicating between the one surface and the other surface. The conductive layer has a conductive portion formed to cover the openings of the first through holes at the one surface of the insulating substrate. The semiconductor chip is mounted on the one surface of the insulating substrate. The external connection terminal is joined to the conductive portion through the first through hole and has an outer peripheral surface. The first through hole is defined by the sidewall surface of the insulating substrate which is formed such that the opening area of the first through hole increases from the one surface to the other surface of the insulating substrate. The outer peripheral surface of the external connection terminal is a part where stress is concentrated when the insulating substrate is mounted on and connected to a mounting or wiring board by the external connection terminal, in a portion joined to the conductive portion, and is apart from the sidewall surface of the first through hole.

In the region of the insulating substrate without the conductive layer, preferably formed is a second through hole communicating between the one surface and the other surface. The shape of opening of the second through hole preferably has a corner portion.

A semiconductor device according to further another aspect of the present invention includes an insulating substrate, a conductive layer, a semiconductor chip and an external connection terminal. The insulating substrate has one surface, the other surface opposing the one surface, and a plurality of first through holes communicating between the one surface and the other surface. The conductive layer has a conductive portion formed to cover the openings of the first through holes at the one surface of the insulating substrate. The semiconductor chip is mounted on the one surface of the insulating substrate. The external connection terminal is joined to the conductive portion through the first through hole, and has an outer peripheral surface. The first through hole is defined by the sidewall surface of the insulating substrate which is formed such that the opening area of the first through hole increases from the one surface to the other surface of the insulating substrate. The outer peripheral surface of the external connection terminal is apart from a part of the sidewall surface of the first through hole the farthest from the center of the semiconductor chip at a portion joined to the conductive portion.

The outer peripheral surface of the external connection terminal positioned immediately under the semiconductor chip and the closest to the four corners of the semiconductor chip is preferably apart from a part of the sidewall surface of the first through hole the farthest from the center of the chip.

The outer peripheral surface of the external connection terminal positioned outside the outer peripheral edge of the semiconductor chip is preferably apart from a part of the sidewall surface of the first through hole the closest to the center of the semiconductor chip. The outer peripheral surface of the external connection terminal positioned outside the outer peripheral edge of the semiconductor chip and the closest to the four corners of the semiconductor chip is preferably apart from a part of the sidewall surface of the first through hole, the closest to the center of the chip.

The outer peripheral surface of the external connection terminal is preferably apart from the sidewall surface of the first through hole at a part of a first sidewall surface of the first through hole the farthest from the center of the semiconductor chip and at a part of a second sidewall surface of the first through hole the closest to the center of the chip. Furthermore, the outer peripheral surface of the external connection terminal is preferably apart from the sidewall surface of the first through hole at a part of a third sidewall surface and a part of a fourth sidewall surface between the part of the first sidewall surface and the part of the second sidewall surface, respectively.

In the region of the insulating substrate without the conductive region, preferably formed is a second through hole communicating between the one surface and the other surface. The shape of the opening of the second through hole preferably has a corner portion.

A method of manufacturing a semiconductor device according to another aspect of the present invention includes the following steps of:

(a) etching an insulating substrate using a mask having a plurality of first openings, thereby forming a plurality of first through holes communicating between one surface of the insulating substrate and the other surface opposing the one surface, corresponding to the first openings;

(b) forming a conductive layer having a conductive portion covering the openings of the first through holes on the one surface of the insulating substrate;

(c) placing a semiconductor chip on the one surface of the insulating substrate and on the conductive portion; and (d) filling in the first through hole and fusing a material for an external connection terminal, thereby joining the external connection terminal to the conductive portion through the first through hole.

The first through hole is defined by the sidewall surface of the insulating substrate which is formed such that the opening area of the first through hole increases from the one surface to the other surface of the insulating substrate. The shape of a first opening of a mask has a projected portion at a part corresponding to the sidewall surface of the first through hole where stress is concentrated when the insulating substrate having a semiconductor chip mounted on the one surface is mounted on and connected to a wiring board by the external connection terminal.

The step of forming the plurality of first through holes in the insulating substrate preferably includes etching the insulating substrate using a mask having a second opening in the region corresponding to the region between the first through holes in the insulating substrate and without the conductive region, thereby forming a second through hole communicating between the one surface and the other surface of the insulating substrate, corresponding to the second opening of the mask. The shape of the second opening of the mask preferably has a corner portion.

A method of manufacturing a semiconductor device according to yet another aspect of the present invention includes the following steps of:

(a) etching an insulating substrate using a mask having a plurality of first openings, thereby forming in the insulating substrate a plurality of first through holes communicating between one surface of the insulating substrate to the other surface opposing the one surface, corresponding to the first opening;

(b) forming a conductive layer having a conductive portion covering the opening of the first through holes on the one surface of the insulating substrate;

(c) placing a semiconductor chip on the one surface of the insulating substrate and on the conductive portion; and (d) filling in the first through hole and fusing a material for an external connection terminal, thereby joining the external connection terminal to the conductive portion through the first through hole.

The first through hole is defined by the sidewall surface of the insulating substrate which is formed such that the opening area of the first through hole increases from the one surface to the other surface of the insulating substrate. The shape of first opening of the mask has a projected portion at a part corresponding to the sidewall surface of the first through hole the farthest from the center of the semiconductor chip.

The shape of the first opening of the mask corresponding to the first through hole positioned immediately under the semiconductor chip the closest to each of the four corners of the semiconductor chip preferably has a projected portion at a part corresponding to a part of the sidewall surface of the first through hole the farthest from the center of the semiconductor chip.

The shape of the first opening of the mask corresponding to the first through hole positioned outside the outer peripheral edge of the semiconductor chip preferably has a projected portion at a part corresponding to a part of the sidewall surface of the first through hole the closest to the semiconductor chip. The shape of the first opening of the mask corresponding to the first through hole positioned outside the outer peripheral edge of the semiconductor chip the closest to each of the four corners of the semiconductor chip preferably has a projected portion at a part corresponding to a part of the sidewall surface of the first through hole the closest to the center of the semiconductor chip.

The shape of the first opening of the mask preferably has a first projected portion at a part corresponding to a part of the sidewall surface of the first through hole the farthest from the center of the semiconductor chip, and a second projected portion at a part corresponding to a part of the sidewall of the fist through hole the closest to the center of the semiconductor chip. Furthermore, the shape of the first opening of the mask preferably has third and fourth projected portions between the first and second projected portions, respectively.

The step of forming the plurality of first through holes in the insulating substrate preferably includes etching the insulating substrate using a mask having a second opening in a region corresponding to a region between the first through holes in the insulating substrate and in a region corresponding to a region without the conductive layer, thereby forming in the insulating substrate a second through hole communicating between the one and the other surfaces of the insulating substrate, corresponding to the second opening of the mask. The shape of the second opening of the mask preferably has a corner portion.

As in the foregoing, according to the present invention, a semiconductor device having a plurality of first through holes formed by etching, and allowing the cost to be reduced as compared to the use of a drill, dice or the like, a semiconductor device having increased reliability than conventional devices, particularly in a chip size package can be provided.

Furthermore, since at least the outer peripheral surface of the external connection terminal positioned immediately under the semiconductor chip and the closest to each of the four corners of the semiconductor chip is apart from the sidewall surface of the first through hole in the region including at least a region of the first through hole on a circumference the farthest from the center of the semiconductor chip, the concentration of stress can be surely alleviated.

Since the outer peripheral surface of the external connection terminal positioned outside the outer peripheral edge of the semiconductor chip is apart from the sidewall surface of the first through hole in the region including at least a region of the first through hole on a circumference the closest to the center of the semiconductor chip, the reliability can be improved as compared to the conventional devices even if the external connection terminal is located outside the semiconductor chip. In addition, since the outer peripheral surface of the external connection terminal the closest to each of the four corners of the semiconductor chip is apart from the sidewall surface of the first through hole in the region including at least a region of the first through hole on a circumference the closest to the center of the semiconductor chip, the reliability can be more improved.

Since the outer peripheral surface of the external connection terminal is apart from the sidewall of the first through hole in a region including a region of the first through hole on a circumference the farthest from the center of the semiconductor chip and on a circumference the closest to the center of the semiconductor chip, an insulating substrate or an etching mask having the same opening of the first through hole can be used regardless of the size of the insulating substrate relative to the chip size.

In addition, since the outer peripheral surface of the external connection terminal is apart from the sidewall surface of the first through hole in the region having the third and fourth projected portions between the first and second projected portions, respectively, the precision of the central position of the external connection terminal and the height of the external connection terminal of the semiconductor device can be more equalized.

Furthermore, since the second through hole is provided in the region between the first through holes in the insulating substrate and in the region other than the conductive layer, stress can be more alleviated, and if the opening of the second through hole is formed into a shape other than a circular shape, the stress can be even more alleviated.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The present invention will be now described in detail with reference to embodiments thereof.

Figure 1:
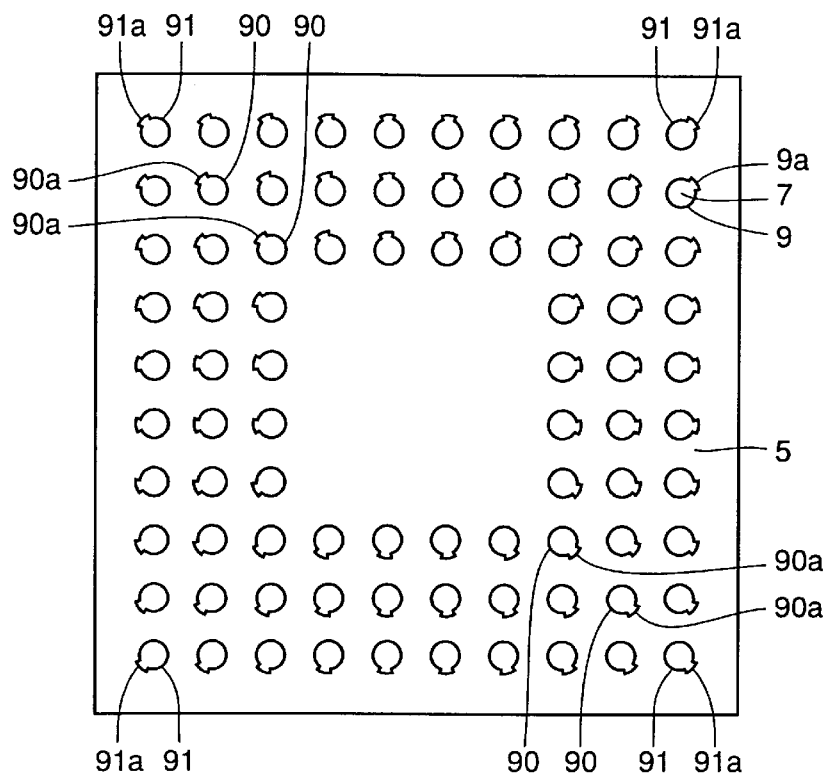
FIG. 1 is a view of through holes in an insulating substrate in a semiconductor device according to a first embodiment of the present invention seen from the side of an external connection terminal.
Figure 2:
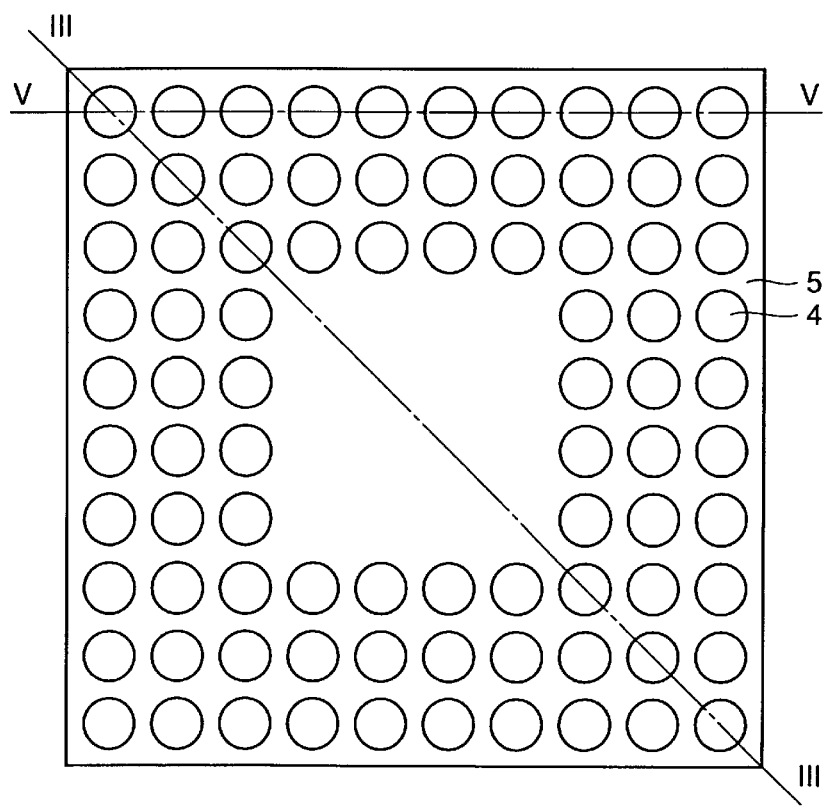
FIG. 2 is a view of the semiconductor device according to the first embodiment seen from the side of the external connection terminal.
Figure 3:
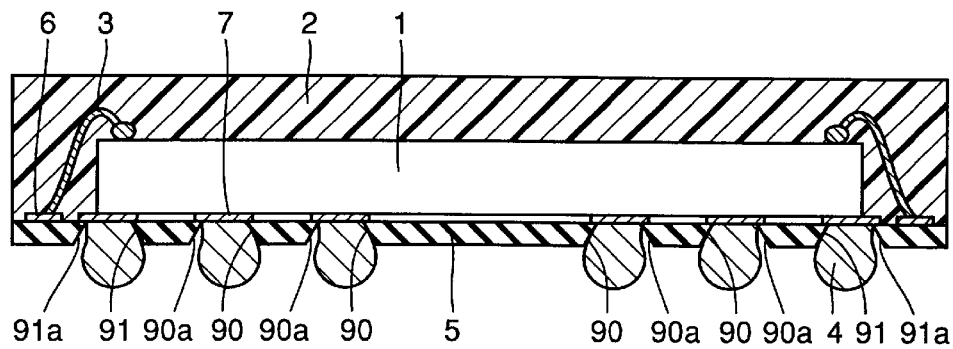
FIG. 3 is a cross sectional view of the semiconductor device according to the first embodiment taken along line III—III in FIG. 2.

FIG. 1 is a view of through holes before being provided with external connection terminals in a semiconductor device according to a first embodiment of the present invention, seen from the backside of the semiconductor device, FIG. 2 is a view after external connection terminals are provided, seen from the backside of the semiconductor device, and FIG. 3 is a cross sectional view taken along line III—III in FIG. 2. The semiconductor device according to the embodiment is a foursquare type, CSP, and more specifically, a semiconductor chip 1 is mounted on a foursquare wiring (interconnection) board 5 as an insulating substrate, and a wiring (interconnection) pattern 6 for connection with semiconductor chip 1 is formed as a conductive layer in an outer peripheral region of semiconductor chip 1. Semiconductor chip 1 and wiring pattern 6 are electrically connected by wire-bonding using a gold (Au) wire 3.

Wiring board 5 is provided with an array of first through holes 9 formed such that its opening area expands from the semiconductor chip mounting surface toward the opposite surface. Similarly to the conventional cases, first through hole 9 can be readily formed by application of photoresist on an insulating substrate, patterning to form an opening having the following shape and etching using the patterned photoresist as a mask. The etching may be either wet or dry etching. The first through hole may be provided using a laser.

Figure 8:
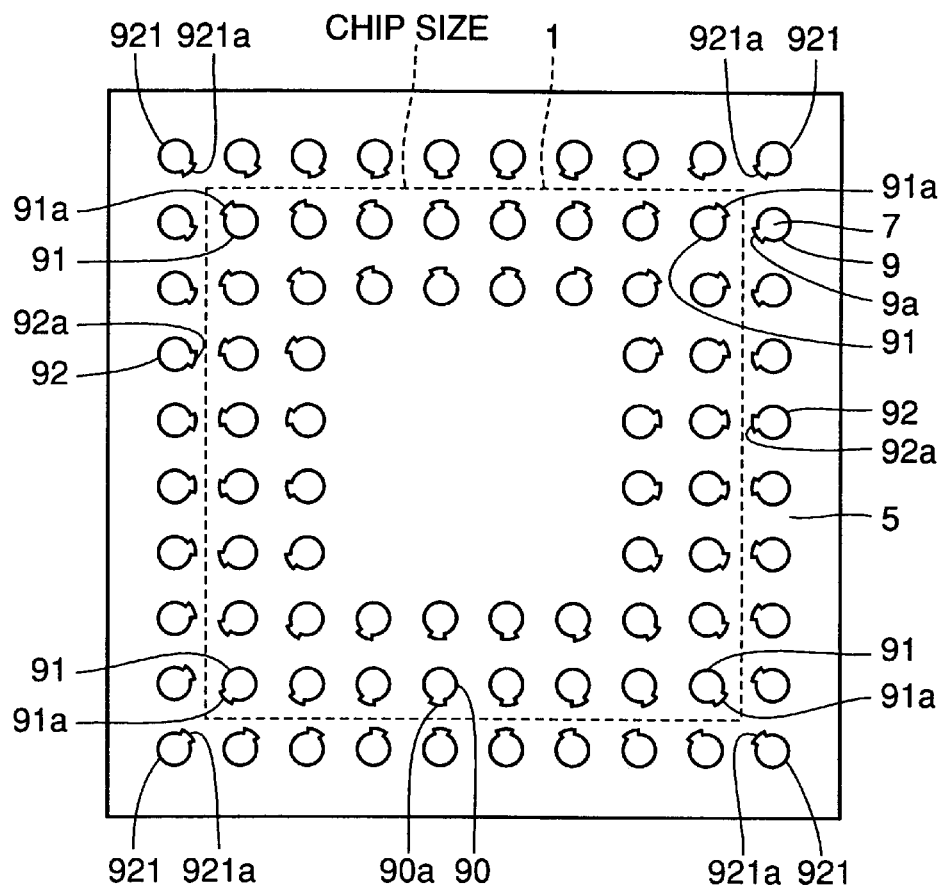
FIG. 8 is a view of through holes in an insulating substrate in a semiconductor device according to a third embodiment of the present invention seen from the side of the external connection terminal.
Figure 10:
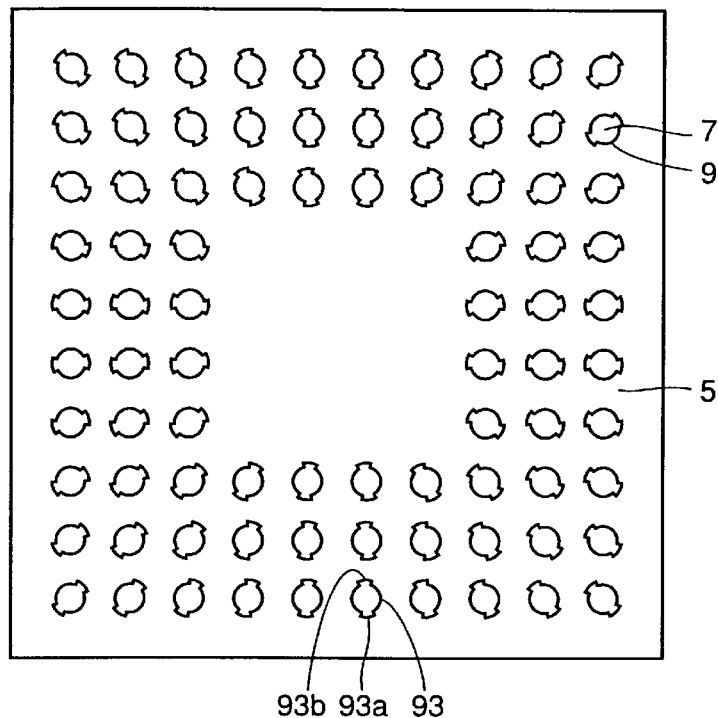
FIG. 10 is a plan view of through holes having projected portions in two directions.
Figure 11:
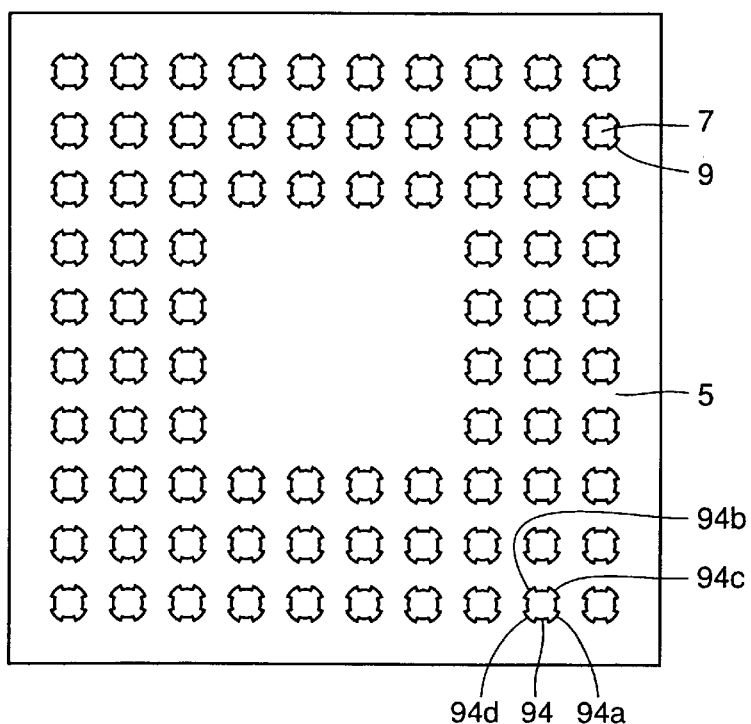
FIG. 11 is a plan view of through holes having projected portions in four directions.
Figure 15:
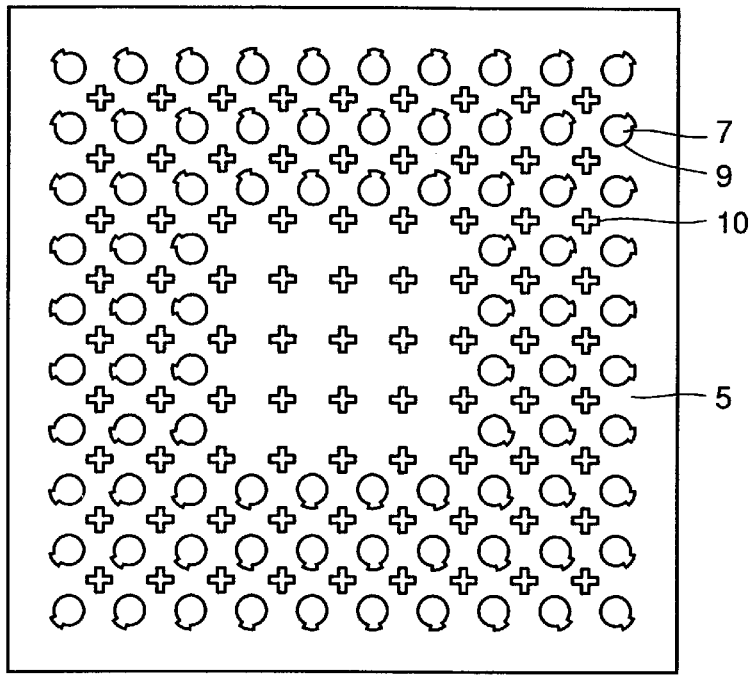
FIG. 15 is a view of through holes in an insulating substrate in a semiconductor device according to a fourth embodiment of the present invention seen from the side of external connection terminal.
Figure 16:
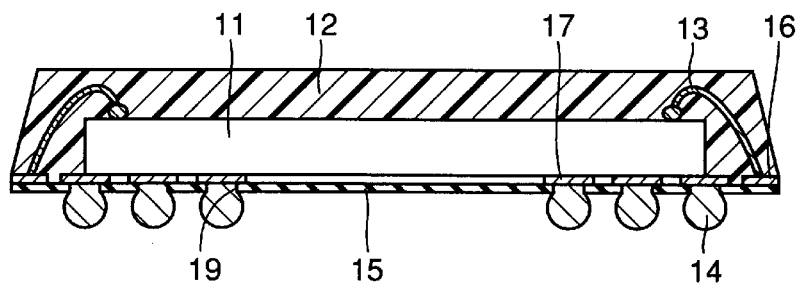
FIG. 16 is a cross sectional view of a conventional semiconductor device.
Figure 17:
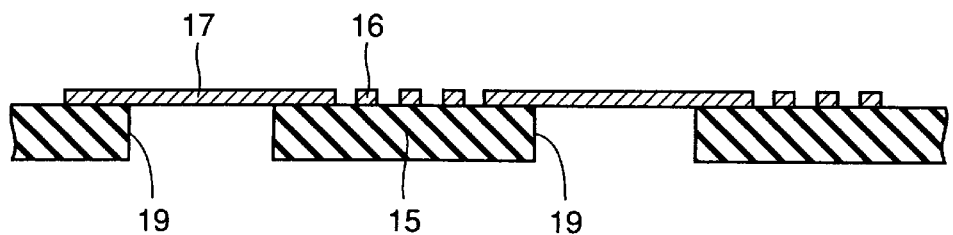
FIG. 17 is a view of a cross section of through holes formed by dice and a drill.
Figure 18:
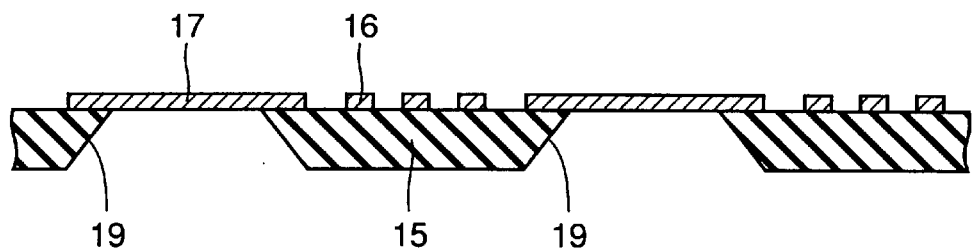
FIG. 18 is a cross sectional view of a through hole formed by etching.

The shape of the opening formed in the photoresist is desirably a circular shape having a projected portion in a region including at least a region on a circumference the farthest from the center of semiconductor chip 1. Also as shown in FIG. 1, the opening shape of photoresist corresponding to a first through hole 91 positioned immediately under semiconductor chip 1 and the closest to at least each of the four corners of semiconductor chip 1 is desirably a circular shape having a projected portion 91a in a region including at least a region on a circumference the farthest from the center of semiconductor chip 1. As shown in FIG. 8, the opening shape of photoresist corresponding to a first through hole 92 positioned outside the edge of semiconductor chip 1 is desirably a circular shape having a projected portion 92a in a region including at least a region on a circumference the closest to the center of semiconductor chip 1. Among first through holes 92 outside semiconductor chip 1, the opening shape of photoresist corresponding to first through holes 921 the closest to the four corners of semiconductor chip 1 is desirably a circular shape having a projected portion 921a in a region including at least a region on a circumference the closest to the center of semiconductor chip 1. As shown in FIG. 10, the opening shape of photoresist corresponding to a first through hole 93 may be a circular shape having a first projected portion 93a and a second projected portion 93b, respectively in a region including a region on a circumference the farthest from the center of semiconductor chip 1 and in a region including a region on a circumference the closest to the center of semiconductor chip 1, while as shown in FIG. 11, the opening shape of photoresist corresponding to a first through hole 94 may be a circular shape having a third projected portion 94c and a fourth projected portion 94d between a first projected portion 94a and a second projected portion 94b, respectively. As shown in FIG. 15, there may be provided an opening (second through hole) 10 in a region of photoresist corresponding to a region between first through holes 9 in insulating substrate 5 and in a region other than land portion 7, and the shape of the opening is desirably a non-circular shape.

In a region between semiconductor chip 1 and wiring board 5 provided is land portion 7 for connecting an external connection terminal (hereinafter simply as "land portion") covering the entire surface of the opening of first through hole 9 and electrically connected with wiring pattern 6.

After semiconductor chip 1 is mounted on wiring board 5, semiconductor chip 1 and wire 3 are encapsulated by resin 2 by a transfer molding method, and a solder ball is connected to land portion 7 as an external connection terminal 4 through first through hole 9. More specifically, first through hole 9 is filled with a solder ball or the like to be a material for the external connection terminal and fused (reflow), so that the entire surface of land portion 7 and the solder ball are connected to form external connection terminal 4.

Wiring pattern 6 and land portion 7 are formed by a copper (Cu) foil, and a surface exposed from first through hole 9 in land portion 7 on the chip placing side is plated with nickel (Ni) and gold (Au). When the Ni/Au-plated surface is subjected to solder connection, a Au—Sn alloy layer is formed in the vicinity of the joint, but the alloy layer is hard and brittle and could be easily broken by the concentration of stress.

Figure 13:
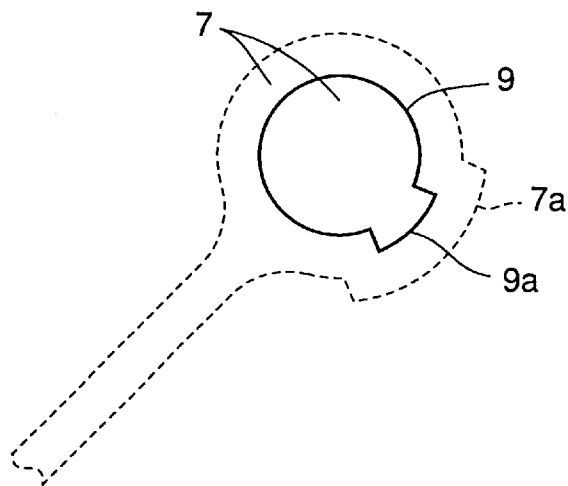
FIG. 13 is a view showing the positional relation between a land portion and a first through hole according to the present invention.
Figure 19:
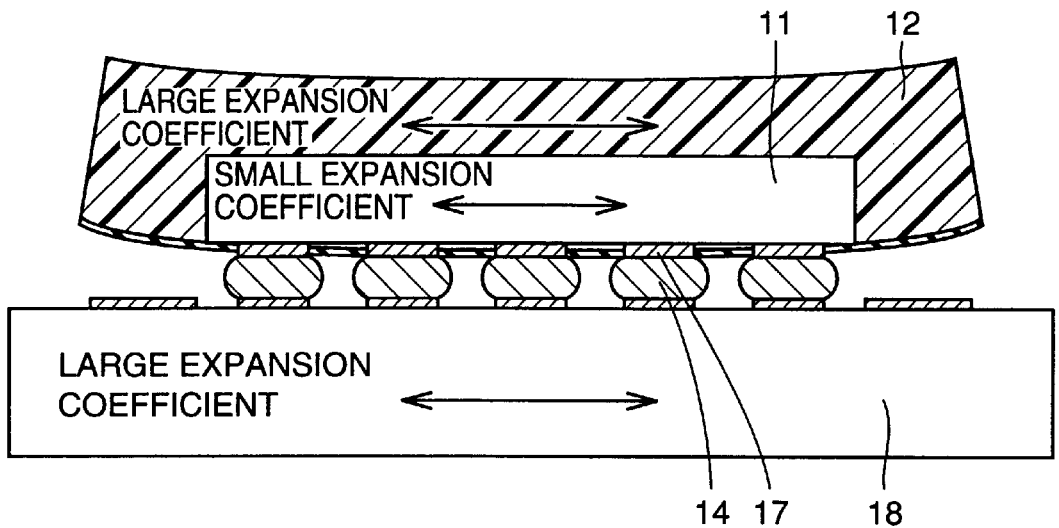
FIG. 19 is a view for use in illustration of stress generated between a wiring board and a semiconductor device.
Figure 20:
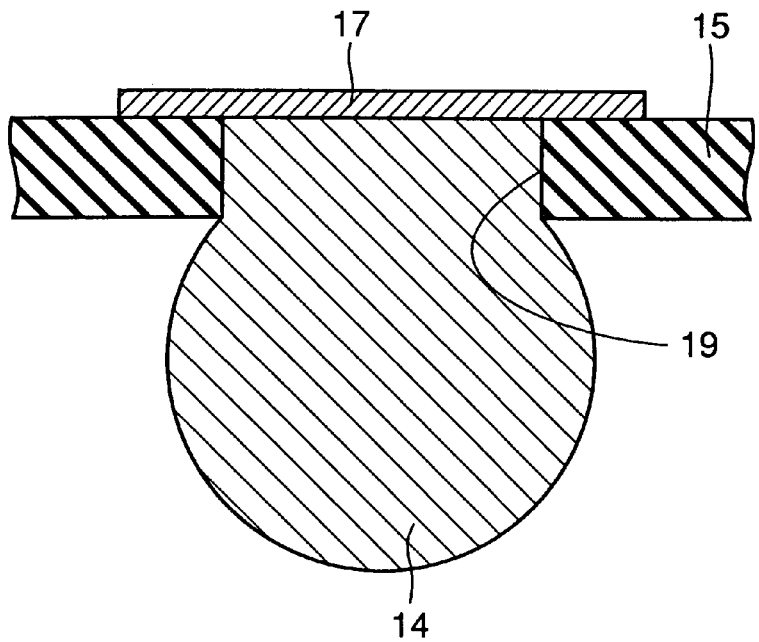
FIG. 20 is a cross sectional view of a land having a shape as shown in FIG. 17 connected with a solder ball as an external connection terminal.
Figure 21:
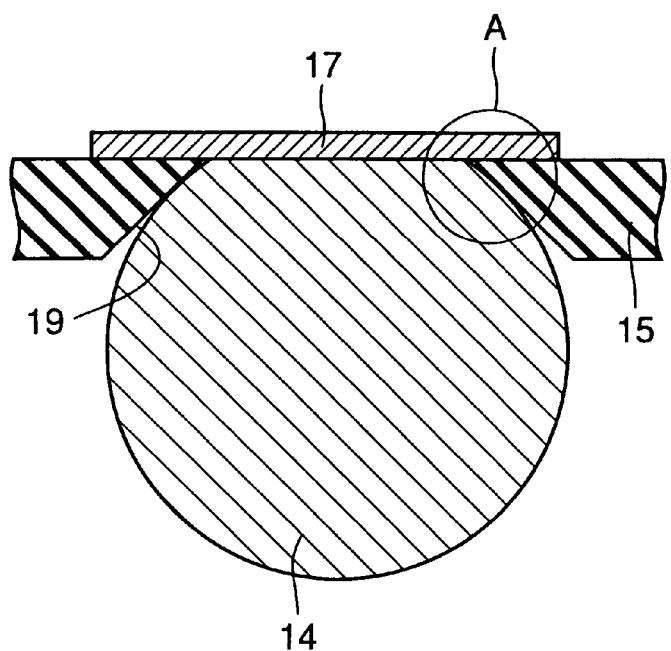
FIG. 21 is a cross sectional view of a land having a shape as shown in FIG. 18 connected with a solder ball as an external connection terminal.

Therefore, according to the present invention, the opening shape of first through hole 9 has a circular shape having a projected portion 9a on a circumference as shown in FIG. 13. Projected portion 9a is desirably provided in a region of first through hole 9 where stress is concentrated at the connection portion between land portion 7 and external connection terminal 4, and in the embodiment shown in FIG. 1, the projected portion is formed in a region including a region the farthest from the center of semiconductor chip 1 on a circumference of first through hole 9. When all the external connection terminals are positioned under semiconductor chip 1, stress concentrates at the position the farthest from the center of the package as shown in FIG. 19, and therefore projected portion 91a is formed at each of first through holes 91 the closest to the four corners of semiconductor chip 1 as shown in FIG. 1. Note that in FIG. 13, the shape of land portion 7 takes a similar shape to first through hole 9 to secure a margin, but the present invention is not limited to this particular shape as shown in broken line in FIG. 13, as long as at least land portion 7 can cover the entire opening portion of first through hole 9.

Figure 4:
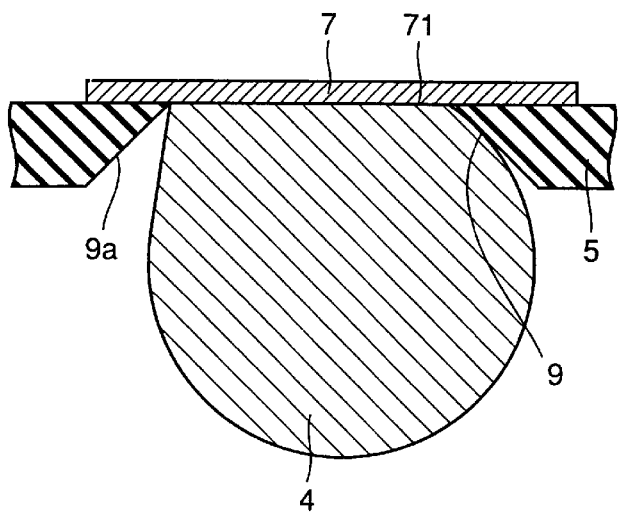
FIG. 4 is an enlarged view of the vicinity of the external connection terminal in FIG. 3.

FIG. 4 is an enlarged view of the portion to which a solder ball is connected as external connection terminal 4 in FIG. 3. The shape of external connection terminal 4 after the solder ball is connected allows the solder to wet and spread over projected portion 7a (FIG. 13) and the balance of the surface tension of the solder allows the vicinity of the interface of the joint between land portion 7 and the solder ball as external connection terminal 4 to take a shape almost perpendicular to a wiring pattern forming surface 71 on one side, and an angular shape on the other side. More specifically, the shape of the joint at the part of first through hole 9 provided with projected portion 9a is different from the other part, and external connection terminal 4 is apart from the sidewall of through hole 9, and takes a shape almost perpendicular to wiring pattern forming surface 71. Therefore, in the cross section shown in FIG. 4, temperature cycle resistance is improved because stress is dispersed around the vicinity of the joint between the solder ball as external connection terminal 4 and land portion 7.

According to the present invention, in the part of first through hole 9 provided with projected portion 9a, external connection terminal 4 is provided apart from the sidewall of first through hole 9, stress is dispersed and this feature similarly applies to the following embodiments.

Figure 5:
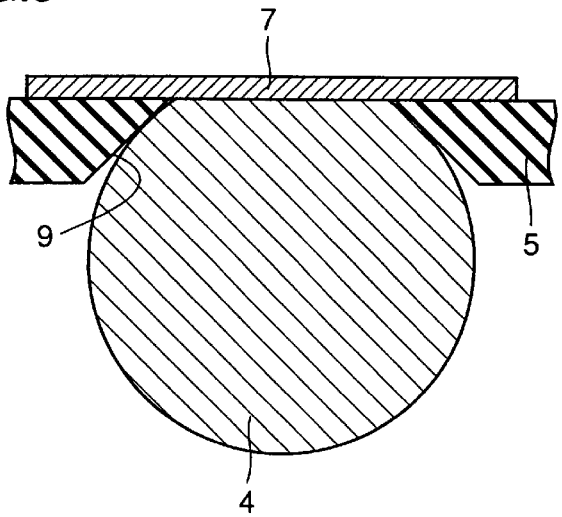
FIG. 5 is a partially enlarged view of the vicinity of the external drill, connection terminal showing a part of a section taken along line V—V in FIG. 2.

Meanwhile, a part of a cross section taken along line V—V in FIG. 2, as shown in FIG. 5, takes an angular form on both sides, and stress concentrates at the connection portion between the solder ball as external connection terminal 4 and land portion 7 as described above. However, the shape of first through hole 9 is formed into a circular shape provided with projected portion 9a, the solder ball as external connection terminal 4 takes a shape as shown in FIG. 4 and the reliability improves.

Figure 14:
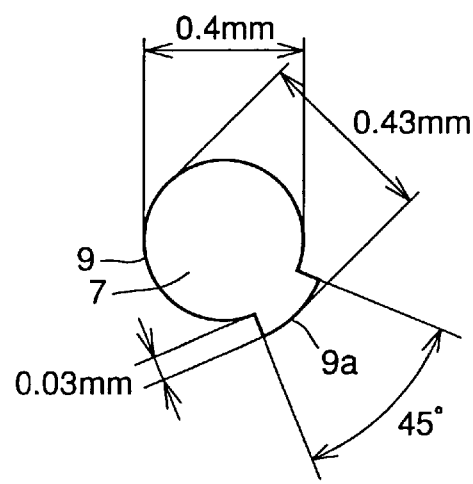
FIG. 14 is a view showing the size of each part of the first through hole according to the first embodiment.

The size and shape of projected portion 9a provided at first through hole 9 is optimized by the material and size of the solder ball such that there is no position with stress concentration at the connection portion between the land and solder ball. According to the embodiment, as shown in FIG. 14, a circular land portion having a base material as thick as 0.05 mm and a diameter of 0.4 mm is provided with a projected portion 9a cut at an angle of 45° and a depth of 0.03 mm.

In the semiconductor device according to the present invention, the method of electrically connecting semiconductor chip 1 and insulating substrate 5 is not particularly limited to the die bonding method between semiconductor chip 1 and insulating substrate 5. Insulating substrate 5 is a resin substrate or film having high thermal resistance and the material is not particularly limited.

Figure 6:
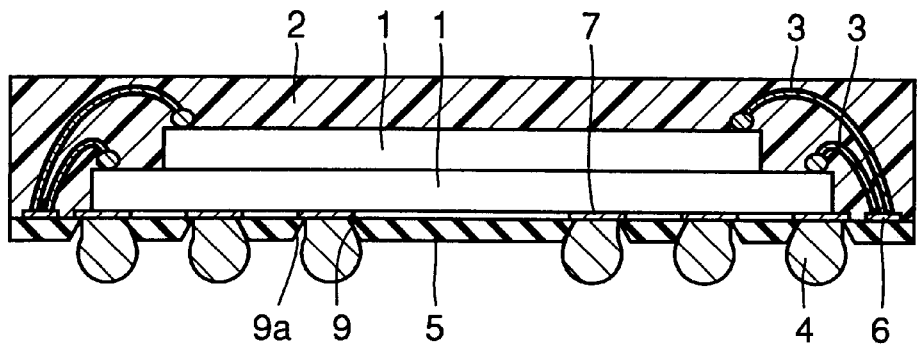
FIG. 6 is a cross sectional view of a semiconductor device according to a second embodiment of the present invention.
Figure 7:
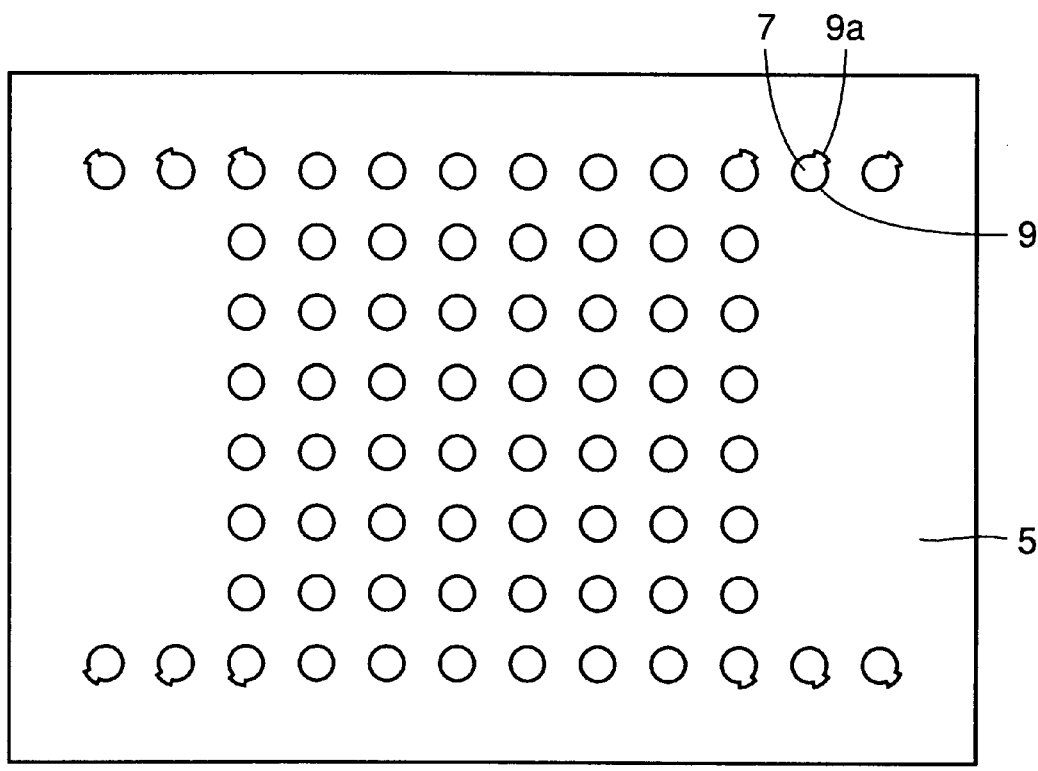
FIG. 7 is a view of through holes in an insulating substrate in the semiconductor device according to the second embodiment seen from the side of the external connection terminal.

FIG. 6 is a cross sectional view of a second embodiment of the present invention. FIG. 7 is a view of through holes seen from the side of an external connection terminal. The embodiment corresponds to a semiconductor device including two semiconductor chips 1 mounted upon each other. Since drawing of a wiring pattern is more complicated than the case of the first embodiment, the number of lands whose shapes can be changed decreases if the same wiring rule is applied. Therefore, projected portion 9a is formed only in the vicinity of through hole 9 which is positioned far from the center of the package, subject to the largest stress, and might have cracks earlier than any other parts.

Figure 9:
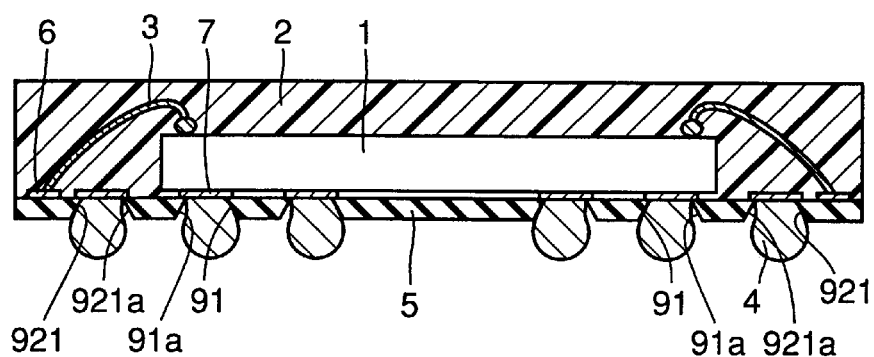
FIG. 9 is a cross sectional view of the semiconductor device according to the third embodiment.

FIG. 8 is a view of the opening shape of a land in a semiconductor device according to a third embodiment of the present invention, and FIG. 9 is a cross sectional view thereof. In the semiconductor device according to the embodiment, external connection terminal 4 is mounted inside and outside of the placing position of semiconductor chip 1. In such a structure, stress on the solder connection portion is imposed on external connection terminals 4 the farthest from the center of the package among external connection terminals 4 under semiconductor chip 1, and on external connection terminals 4 the closest to the center of the package among external connection terminals 4 outside semiconductor chip 1. Therefore, in the semiconductor device according to the embodiment, a first through hole 90 under semiconductor chip 1 has a projected portion 90a outward from the package, and a first through hole 92 outside semiconductor chip 1 has a projected portion 92a toward the center of the package. By providing projected portion 91a at least at first through hole 91 positioned immediately under semiconductor chip 1 the closest to each of the four corners of semiconductor chip 1, the concentration of stress can be reduced, and a projected portion 921a is desirably provided at first through hole 921 positioned outside semiconductor chip 1 and the closest to each of the four corners of semiconductor chip 1.

Figure 12:
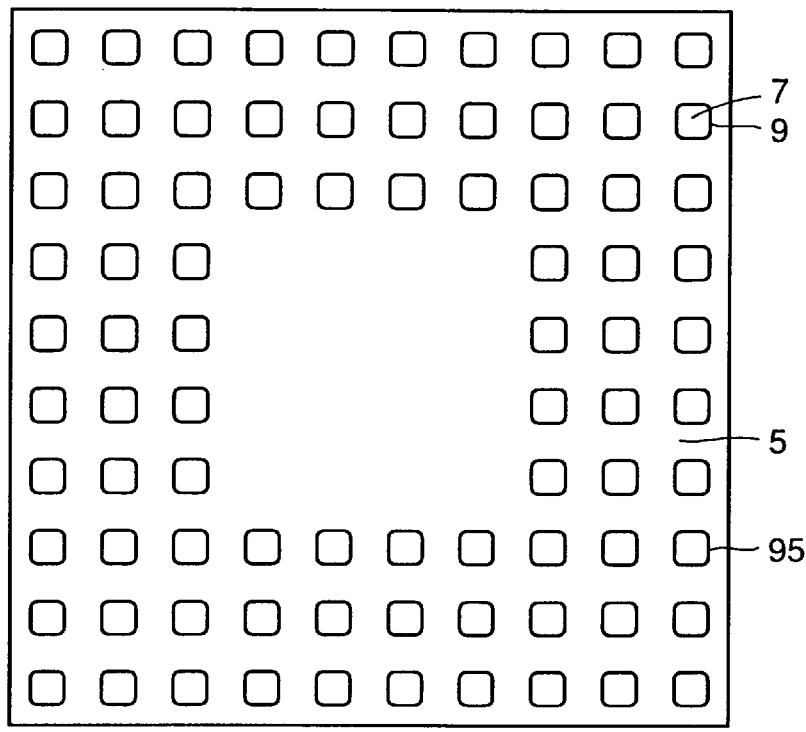
FIG. 12 is a plan view of a rectangular through hole.

The projected portion to be formed at first through hole 9 does not have to be in one direction as shown in FIGS. 10 and 11. As shown in FIG. 10, since projected portions 93a and 93b are provided in two directions of first through hole 93, an insulating substrate or an etching mask having the same opening shape for the first through hole can be used regardless of the chip size. As shown in FIG. 11, if projected portions 94a, 94b, 94c and 94d are provided in four directions of first through hole 94, the shape of all the balls can be the same. Furthermore, since a first through hole 95 having a square shape can provide the same effects as one form provided with projected portions in four directions of a circle as shown in FIG. 12.

As shown in FIG. 15, as a fourth embodiment, a second through hole 10 for air vent provided between land portions may be formed using the same mask simultaneously at the time of forming first through hole 9, so that the concentration of stress can be more reduced. The opening shape of second through hole 10 may be a circular shape or a non-circular shape, and if, for example, such a non-circular shape as a cross shape having a corner portion, an L shape, a rectangular shape or the like is employed, the concentration of stress can be even more reduced. In particular, the cross shape can effectively reduce stress in any of the lengthwise and transverse directions, but if an opening of a cross shape is difficult to form in connection with a wiring pattern, an L shape or a rectangular shape may be employed.

In the semiconductor device according to the present invention, the shape of the land is not restricted, and by providing a projected portion in a region where stress concentrates in the connection portion of the land portion and the external connection terminal, the connection shape between land portion 7 and the solder ball as external connection terminal 4 as shown in FIG. 4 can provide the same effects.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate for a semiconductor device, comprising:
    an insulating substrate having one surface and the other surface opposing the one surface and having a plurality of first through holes communicating between the one surface and the other surface; and
    a conductive layer having a conductive portion formed to cover the opening portion of said first through hole in the one surface of said insulating substrate,
    said first through hole being defined by a sidewall surface of said insulating substrate, said sidewall surface of said insulating substrate being formed such that the opening area of said first through hole increases from the one surface to the other surface of said insulating substrate,
    the shape of the opening of said first through hole having a projected portion at a part where stress concentrates when said insulating substrate having a semiconductor chip mounted on the one surface is mounted on and connected to a mounting board by an external connection terminal joined to said conductive portion through said first through hole.

2. The substrate according to claim 1, wherein a second through hole communicating between the one surface and the other surface is formed in a region of said insulating substrate without said conductive portion layer.

3. The substrate according to claim 2, wherein the shape of the opening of said second through hole has a corner portion.

4. A substrate for a semiconductor device, comprising:
    an insulating substrate having one surface and the other surface opposing the one surface and having a plurality of first through holes communicating between the one surface and the other surface; and
    a conductive layer having a conductive portion formed to cover the opening of said first through hole in the one surface of said insulating substrate,
    said first through hole being defined by the sidewall surface of said insulating substrate, the sidewall surface of said insulating substrate being formed such that the opening area of said first through hole increases from the one surface to the other surface of said insulating substrate, the shape of the opening of said first through hole having a projected portion at a part of the sidewall surface of said insulating substrate the farthest from the center of a semiconductor chip mounted on the one surface of said insulating substrate when said insulating substrate having a semiconductor chip mounted on the one surface is mounted on and connected to a mounting board by an external connection terminal joined to said conductive portion through said first through hole.

5. The substrate according to claim 4, wherein the shape of the opening of said first through hole positioned immediately under the semiconductor chip and the closest to each of the four corners of the semiconductor chip has a projected portion at a part of the sidewall surface of said insulating substrate the farthest from the center of the semiconductor chip.

6. The substrate according to claim 4, wherein the shape of the opening of said first through hole positioned outside the outer peripheral edge of the semiconductor chip has a projected portion at a part of the sidewall surface of said insulating substrate the closest to the center of the semiconductor chip.

7. The substrate according to claim 6, wherein the shape of the opening of said first through hole positioned outside the outer peripheral edge of the semiconductor chip and the closest to each of the four corners of the semiconductor chip has a projected portion at a part of the sidewall surface of said insulating substrate the closest to the center of the semiconductor chip.

8. The substrate according to claim 4, wherein the shape of the opening of said first through hole has a first projected portion at a part of the sidewall surface of said insulating substrate the farthest from the center of the semiconductor chip and a second projected portion at a part of the sidewall surface of said insulating substrate the closest to the center of the semiconductor chip.

9. The substrate according to claim 8, wherein the shape of the opening of said first through hole has third and fourth projected portions between said first and second projected portions, respectively.

10. The substrate according to claim 4, wherein a second through hole communicating between the one surface and the other surface is formed in a region of said insulating substrate without said conductive layer.

11. The substrate according to claim 10, wherein the shape of the opening of said second through hole has a corner portion.

12. A semiconductor device, comprising:
an insulating substrate having one surface and the other surface opposing the one surface, and having a plurality of first through holes communicating between the one surface and the other surface;
a conductive layer having a conductive portion formed to cover the opening of said first through hole in the one surface of said insulating substrate;
a semiconductor chip mounted on the one surface of said insulating substrate; and
an external connection terminal joined to said conductive portion through said first through hole and having an outer peripheral portion,
said first through hole being defined by a sidewall surface of said insulating substrate, the sidewall surface of said insulating substrate being formed such that the opening area of said first through hole increases from the one side to the other side of said insulating substrate,
the outer peripheral surface of said external connection terminal being apart from the sidewall surface of said first through hole at a part where stress concentrates when said insulating substrate is mounted on and connected to a mounting board by said external connection terminal, in a portion jointed to said conductive portion.

13. The semiconductor device according to claim 12, wherein
a second through hole communicating between the one surface and the other surface is formed in a region of said insulating substrate without said conductive layer.

14. The semiconductor device according to claim 13, wherein said second through hole has a corner portion.

15. A semiconductor device, comprising:
an insulating substrate having one surface and the other surface opposing the one surface and having a plurality of first through holes communicating between the one surface and the other surface;
a conductive layer having a conductive portion formed to cover the opening of said first through hole in the one surface of said insulating substrate;
a semiconductor chip mounted on the one surface of said insulating substrate; and
an external connection terminal joined to said conductive portion through said first through hole and having an outer peripheral surface,
said first through hole being defined by a sidewall surface of said insulating substrate, the sidewall surface of said insulating substrate being formed such that the opening area of said first through hole increases from the one surface to the other surface of said insulating substrate,
the outer peripheral surface of said external connection terminal being apart from a part of the sidewall surface of said first through hole the farthest from the center of said semiconductor chip at a portion joined to said conductive portion.

16. The semiconductor device according to claim 15, wherein the outer peripheral surface of said external connection terminal positioned immediately under said semiconductor chip and the closest to each of the four corners of said semiconductor chip is apart from a part of the sidewall surface of said first through hole the farthest from the center of said semiconductor chip.

17. The semiconductor device according to claim 15, wherein the outer peripheral surface of said external connection terminal positioned outside the outer peripheral edge of said semiconductor chip is apart from a part of the sidewall surface of said first through hole the closest to the center of said semiconductor chip.

18. The semiconductor device according to claim 17, wherein the outer peripheral surface of said external connection terminal positioned outside the outer peripheral edge of said semiconductor chip and the closest to each of the four corners of said semiconductor chip is apart from a part of the sidewall surface of said first through hole the closest to the center of said semiconductor chip.

19. The semiconductor device according to claim 15, wherein the outer peripheral surface of said external connection terminal is apart from the sidewall surface of said first through hole at a part of a first sidewall of said first through hole the farthest from the center of said semiconductor chip and at a part of a second sidewall surface of said first through hole the closest to the center of said semiconductor chip.

20. The semiconductor device according to claim 19, wherein the outer peripheral surface of said external connection terminal is apart from the sidewall surface of said first through hole at a part of a third sidewall surface and a part of a fourth sidewall surface between said part of the first sidewall surface and said part of the second sidewall surface, respectively.

21. The semiconductor device according to claim 20, wherein a second through hole communicating between the one surface and the other surface is formed in a region of said insulating substrate without said conductive layer.

22. The semiconductor device according to claim 21, wherein the shape of the opening of said second through hole has a corner portion.

23. A method of manufacturing a semiconductor device, comprising the steps of:

etching an insulating substrate using a mask having a plurality of first openings, thereby forming in said insulating substrate a plurality of first through holes communicating between one surface of said insulating substrate and the other surface opposing the one surface, corresponding to said first openings of said mask;

forming a conductive layer having a conductive portion covering the opening of said first through hole on the one surface of said insulating substrate;

placing a semiconductor chip on said conductive portion and on the one surface of said insulating substrate; and filling in said first through hole and fusing a material for an external connection terminal, thereby joining said external connection terminal to said conductive portion through said first through hole, said first through hole being defined by a sidewall surface of said insulating substrate, the sidewall surface of said insulating substrate being formed such that the opening area of said first through hole increases from the one surface to the other surface of said insulating substrate, the shape of said first opening of said mask having a projected portion at a part corresponding to the sidewall surface of said first through hole where stress concentrates when said insulating substrate having said semiconductor chip on the one surface is mounted on and connected to a mounting board by said external connection terminal.

24. The method according to claim 23, wherein the step of forming said plurality of first through holes in said insulating substrate includes etching said insulating substrate using said mask having a second opening in a region corresponding to a region between said first through holes in said insulating substrate and in a region corresponding to a region without said conductive layer, thereby forming in said insulating substrate a second through hole communicating between the one surface and the other surface of said insulating substrate, corresponding to said second opening.

25. The method according to claim 24, wherein said second opening of said mask has a corner portion.

26. A method of manufacturing a semiconductor device, comprising the steps of:

etching an insulating substrate using a mask having a plurality of first openings, thereby forming in said insulating substrate a plurality of first through holes communicating between one surface of said insulating substrate and the other surface opposing the one surface, corresponding to the first openings of said mask;

forming a conductive layer having a conductive portion covering the opening of said first through hole on the one surface of said insulating substrate;

mounting a semiconductor chip on the one surface of said insulating substrate and on said conductive portion; and filling in said first through hole and fusing a material for an external connection terminal, thereby joining said external connection terminal to said conductive portion through said first through hole, said first through hole being defined by a sidewall surface of said insulating substrate, the sidewall surface of said insulating substrate being formed such that the opening area of said first through hole increases from the one surface to the other surface of said insulating substrate, the shape of said first opening of said mask having a projected portion at a part corresponding to the sidewall surface of said first through hole the farthest from the center of said semiconductor chip.

27. The method according to claim 26, wherein the shape of said first opening of said mask corresponding to said first through hole positioned immediately under said semiconductor chip and the closest to each of the four corners of said semiconductor chip has a projected portion at a part corresponding to a part of the sidewall surface of said first through hole the farthest from the center of said semiconductor chip.

28. The method according to claim 26, wherein the shape of said first opening of said mask corresponding to said first through hole positioned outside the outer peripheral edge of said semiconductor chip has a projected portion at a part corresponding to a part of the sidewall surface of said first through hole the closest to the center of said semiconductor chip.

29. The method according to claim 28, wherein the shape of said first opening of said mask corresponding to said first through hole positioned outside the outer peripheral edge of said semiconductor chip and the closest to each of the four corners of said semiconductor chip has a projected portion at a part corresponding to a part of the sidewall surface of said first through hole the closest to the center of the semiconductor chip.

30. The method according to claim 26, wherein the shape of said first opening of said mask has a first projected portion at a part corresponding to a part of the sidewall surface of said first through hole the farthest from the center of said semiconductor chip and a second projected portion at a part corresponding to a part of the sidewall surface of said first through hole the closest to the center of said semiconductor chip.

31. The method according to claim 30, wherein the shape of said first opening of said mask has third and fourth projected portions between said first and second projected portions, respectively.

32. The method according to claim 26, wherein the step of forming said plurality of first through holes in said insulating substrate includes etching said insulating substrate using said mask having a second opening in a region corresponding to a region between said first through holes in said insulating substrate and in a region corresponding to a region without said conductive layer, thereby forming in said insulating substrate a second through hole communicating between the one surface and the other surface of said insulating substrate, corresponding to said second opening of said mask.

33. The method according to claim 32, wherein the shape of said second opening of said mask has a corner portion.

* * * * *